United States Patent
Annapragada (10) Patent No.: US 6,543,459 B1
(45) Date of Patent: Apr. 8, 2003

(54) METHOD OF DETERMINING AN END POINT FOR A REMOTE MICROWAVE PLASMA CLEANING SYSTEM

(75) Inventor: Rao Venkateswara Annapragada, San Jose, CA (US)

(73) Assignee: Koninklijke Philips Electronics N.V., Eindhoven (NL)

(*) Notice: Subject to any disclaimer, the term of this patent is extended or adjusted under 35 U.S.C. 154(b) by 0 days.

(21) Appl. No.: 09/544,805

(22) Filed: Apr. 7, 2000

(51) Int. Cl.⁷ .................................................. B08B 7/04
(52) U.S. Cl. ..................... 134/1.1; 134/18; 134/22.1; 438/905
(58) Field of Search ....................... 134/1, 1.1, 1.2, 134/1.3, 22.1, 18, 902; 438/905

(56) References Cited

U.S. PATENT DOCUMENTS

| | | | |
|---|---|---|---|
| 3,775,277 A | 11/1973 | Pompei et al. | 204/192 |
| 4,962,461 A | 10/1990 | Meyer et al. | 364/482 |
| 5,016,663 A * | 5/1991 | Mase et al. | 134/1 |
| 5,169,407 A * | 12/1992 | Mase et al. | 134/1 |
| 5,830,310 A * | 11/1998 | Doi | 118/723 R |
| 5,900,161 A * | 5/1999 | Doi | 134/1.1 |
| 6,017,414 A * | 1/2000 | Koemtzopoulos et al. | 134/1.1 |
| 6,051,284 A * | 4/2000 | Byrne et al. | 118/671 |
| 6,184,687 B1 * | 2/2001 | Yamage et al. | 324/464 |
| 6,297,165 B1 * | 10/2001 | Okumura et al. | 438/706 |
| 6,303,044 B1 * | 10/2001 | Koemtzopoulos et al. | 134/1.1 |
| 6,351,683 B1 * | 2/2002 | Johnson et al. | 156/345 |

FOREIGN PATENT DOCUMENTS

| | | |
|---|---|---|
| EP | 0 843 348 A2 A3 | 5/1998 |
| JP | 10-22280 * | 1/1998 |
| JP | 11-200053 * | 7/1999 |
| WO | WO 01/77406 A2 A3 | 10/2001 |

OTHER PUBLICATIONS

Patent Abstract of Japan vol. 1998, No. 05, Apr. 30, 1998 & JP 10 022280 A (Hitachi Ltd), Jan. 23, 1998 abstract.
Patent Abstract of Japan vol. 010, No. 343 (E–456) Nov. 19, 1986 & JP 61 145825 A (Matsushita Electric Ind Co Ltd), Ju. 3, 1998 abstract.
Patent Abstract of Japan vol. 2000, No. 4, Aug. 31, 2000 & JP 2000 012530 A (Matsushita Electric Ind Co Ltd), Jan. 14, 2000 abstract & US 6 297 165 A (Matsushita Electric Industrial Co.) Oct. 2, 2001, column 5, line 66–column 6, line 32.
Patent Abstract of Japan vol. 2000, No. 03, Mar. 30, 2000 & JP 11 345778 A (Tokyo Electron Ltd), Dec. 14, 1999 abstract & US 6 238 488 A (Tokyo Electron Limited) May 29, 2001 column 6, line 28—column 8, line 8.

* cited by examiner

Primary Examiner—Alexander Markoff
(74) Attorney, Agent, or Firm—Peter Zawilski (57) ABSTRACT

A method of determining an end point for a remote microwave plasma cleaning system. In one embodiment, the method comprises several steps. The first step is to expose an electrical device to a deposition operation. Next, the electrical device is exposed to a plasma cleaning operation. In the following step, a value for a performance characteristic of the electrical device is measured. In the last step, an amount of cleaning performed on the electrical device is calculated based on a relationship between a baseline value of the performance characteristic and on the measured value of the performance characteristic of the electrical device.

9 Claims, 7 Drawing Sheets

METHOD OF DETERMINING AN END POINT FOR A REMOTE MICROWAVE PLASMA CLEANING SYSTEM

TECHNICAL FIELD

The field of the present invention pertains to processes related to deposition of materials for fabricating semiconductors. More particularly, the present invention relates to the field of determining an end point for a remote microwave plasma cleaning system used to clean deposition equipment.

BACKGROUND ART

The power and usefulness of today's digital integrated circuit (IC) devices is largely attributed to the increasing levels of integration. Electrical components such as resistors, diodes, transistors, and the like are created in the underlying chip, or IC, using photolithography and chemical vapor deposition (CVD). Photolithography defines the shape of a feature on the IC while the CVD is used to deposit an appropriate type of material on the wafer for the component or feature being generated There is a continual motivation to reduce component size in order to increase the number of components on a given size of chip or die. A serious hindrance to proper performance of an IC is contamination of the IC at any stage of the fabrication process. Consequently, a need arises to reduce contamination during the fabrication of an IC.

One stage that can provide contamination is the CVD stage. In this stage, a wafer is place in a CVD chamber, a vacuum is established, and the appropriate materials are introduced into the chamber as a chemical vapor. These materials resultantly deposit on the wafer. However, these same materials also deposit on the equipment holding the wafer, namely the CVD chamber. Because the same chamber is used for repeated deposition operations on wafers, a buildup of deposition material occurs on the equipment. This buildup of material can be a source of contamination as the material sloughs off the chamber walls. One of the materials that build up on the CVD chamber walls is an oxide layer. Consequently, a need arises to remove the buildup of material on a CVD chamber wall arising from the deposition operation.

One conventional method of cleaning the CVD chamber walls remotely generates plasma using microwave energy. The plasma consists of fluorine radicals that are transported to the CVD chamber where they neutralize the oxide layer buildup on the CVD chamber. An important benefit of remote plasma generation is that it saves the CVD walls from ion energy bombardment and thus prevents damage to the chamber walls. However, a complementary weakness of remote plasma generation is that it provides no method of detecting the completion of cleaning the CVD chamber walls. That is, it is not possible to monitor the fluorine species in the chamber, which can signify an end point, when using remote plasma cleaning. Consequently, a need arises for a method to determine the end point of a remote cleaning operation.

Figure 1:
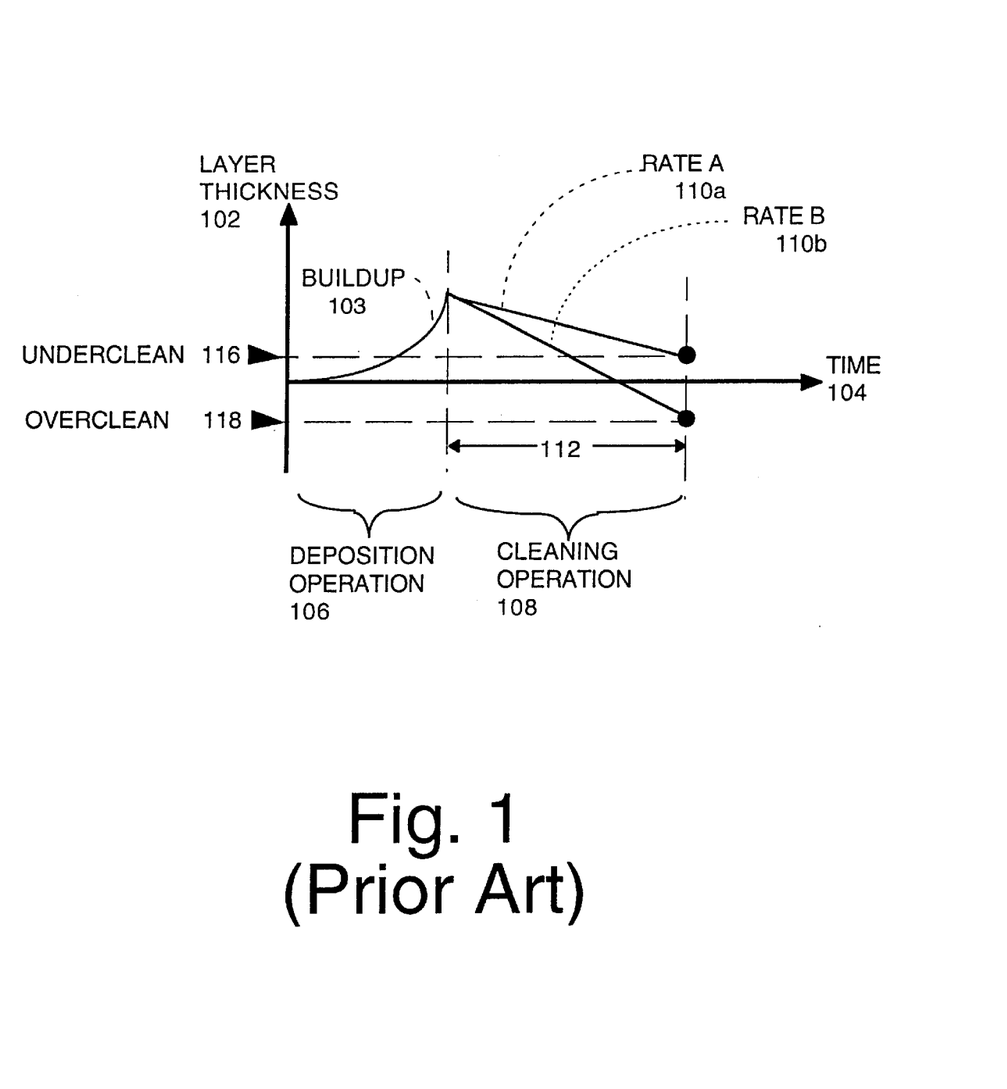
FIG. 1 is a graph showing a conventional cleaning operation for a remote cleaning operation.

Referring now to prior art FIG. 1, a graph 100 showing a conventional end point detection scheme for a remote cleaning operation is shown. Graph 100 has an abscissa of time 104 and an ordinate of layer thickness 102. Deposition operation 106, occurring over a period of time, results in a buildup of a layer thickness 103 on deposition equipment, such as the walls of a CVD chamber. After a sufficient layer of thickness 103 has built up, a cleaning operation 108 occurs over a period of time. Conventional methods have no method of determining the end point of the cleaning operation other than a simple timing operation. Consequently, after a predetermined amount of time 112 of exposing the deposition chamber to one of many different possible cleaning rates, e.g. rate A 110$a$ or rate B 110$b$, the cleaning operation ceases. However, if the length of time for cleaning, or if the rate of cleaning, is not appropriate for the layer thickness built up on the CVD chamber walls, an underclean condition or an overclean condition will exist.

More specifically, underclean condition is represented in prior art FIG. 1 by a residual layer 116 remaining on the CVD chamber walls. In an underclean condition, contaminant may still exist in the CVD chamber, thus risking the integrity of any subsequent deposition operation for an IC. Alternatively, an overclean condition is represented by overclean layer thickness 118, which actually represents a removal of base material from the CVD chamber walls. In this latter scenario, the CVD chamber walls are damaged from overcleaning. Due to the expensive cost of replacement, overcleaning a CVD chamber is an undesirable condition. Because of the detrimental effects of both undercleaning and overcleaning, a need arises for very accurate method of determining when a remote cleaning operation has been completed on a CVD chamber wall.

In summary, a need arises to reduce contamination during the fabrication of an IC. Subsequently, a need arises to remove the buildup of material on a CVD chamber wall arising from the deposition operation. Additionally, a need arises for a method to determine the end point of a remote cleaning operation. Finally, a need arises to very accurately determine when a remote cleaning operation has been completed on a CVD chamber wall, because of the detrimental effects of both undercleaning and overcleaning.

DISCLOSURE OF THE INVENTION

The present invention provides a method to reduce contamination during the fabrication of an IC. More specifically, the present invention provides a method to accurately remove the buildup of material on a CVD chamber wall arising from the deposition operation. The present invention does so by providing a method to determine the end point of a remote cleaning operation. In particular, the present invention provides such an accurate method of determining when a remote cleaning operation has been completed on a CVD chamber wall that it substantially eliminates the detrimental effects of both undercleaning and overcleaning.

Specifically, one embodiment of the present invention provides a method of determining an end point for a remote microwave plasma cleaning system. In one embodiment, the method comprises several steps. The first step is to expose a capacitive electrical device to the deposition operation that the CVD chamber is exposed to between cleanings. Next, the capacitive electrical device, e.g. a capacitor, is exposed to a plasma cleaning operation that the CVD chamber likewise encounters. A capacitive performance characteristic of the capacitor is measured during the cleaning operation. In the last step, an amount of cleaning performed on the capacitor is calculated based on a relationship between a baseline value of the performance characteristic and on the measured value of the performance characteristic of the capacitor. The baseline value represents the capacitive performance characteristic of the capacitor without the deposition layer, and can indicate that the cleaning is completed. This method estimates that the cleaning effectiveness on the electrical device is approximately equivalent to the cleaning effectiveness on the CVD chamber walls. If the end point of the cleaning arises, then an indication is provided.

Another embodiment of the present invention implements the comparison operation in a variety of embodiments. In one embodiment, the comparison operation is performed by a processor coupled to memory. The processor performs the steps of comparing the baseline value with a measured value of the performance characteristic of the capacitive electrical device during the cleaning operation. In another embodiment, the comparison operation is performed by an analog operational amplifier.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The accompanying drawings, which are incorporated in, and form a part of, this specification, illustrate embodiments of the invention and, together with the description, serve to explain the principles of the invention. The drawings referred to in this description should be understood as not being drawn to scale except if specifically noted.

PRIOR ART

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detailed description of the present invention, numerous specific details are set forth in order to provide a thorough understanding of the present invention. However, it will be obvious to one of ordinary skill in the art that the present invention may be practiced without these specific details. In other instances, well-known methods, procedures, components, and circuits have not been described in detail as not to unnecessarily obscure aspects of the present invention.

Some portions of the detailed descriptions which follow, e.g. the processes, are presented in terms of procedures, logic blocks, processing, and other symbolic representations of operations on data bits within a computer or digital system memory. These descriptions and representations are the means used by those skilled in the arts to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Usually, though not necessarily, these physical manipulations take the form of electrical or magnetic signals capable of being stored, transferred, combined, compared, and otherwise manipulated in a processor. For reasons of convenience, and with reference to common usage, these signals are referred to as bits, values, elements, symbols, characters, terms, numbers, or the like with reference to the present invention.

It should be borne in mind, however, that all of these terms are to be interpreted as referencing physical manipulations and quantities and are merely convenient labels to be interpreted further in view of terms commonly used in the art. Unless specifically stated otherwise as apparent from the following discussions, it is understood that throughout discussions of the present invention, terms such as "exposing," "measuring," "determining," "receiving," "repeating," "detecting," or the like, refer to the action and processes that can be implemented by an electronic computing device, that manipulates and transforms data. The data is represented as physical (electronic) quantities within the registers and memories of the device, and is transformed into other data similarly represented as physical quantities within the device components, or computer system memories or registers, or other such information storage, transmission or display devices.

Figure 2A:
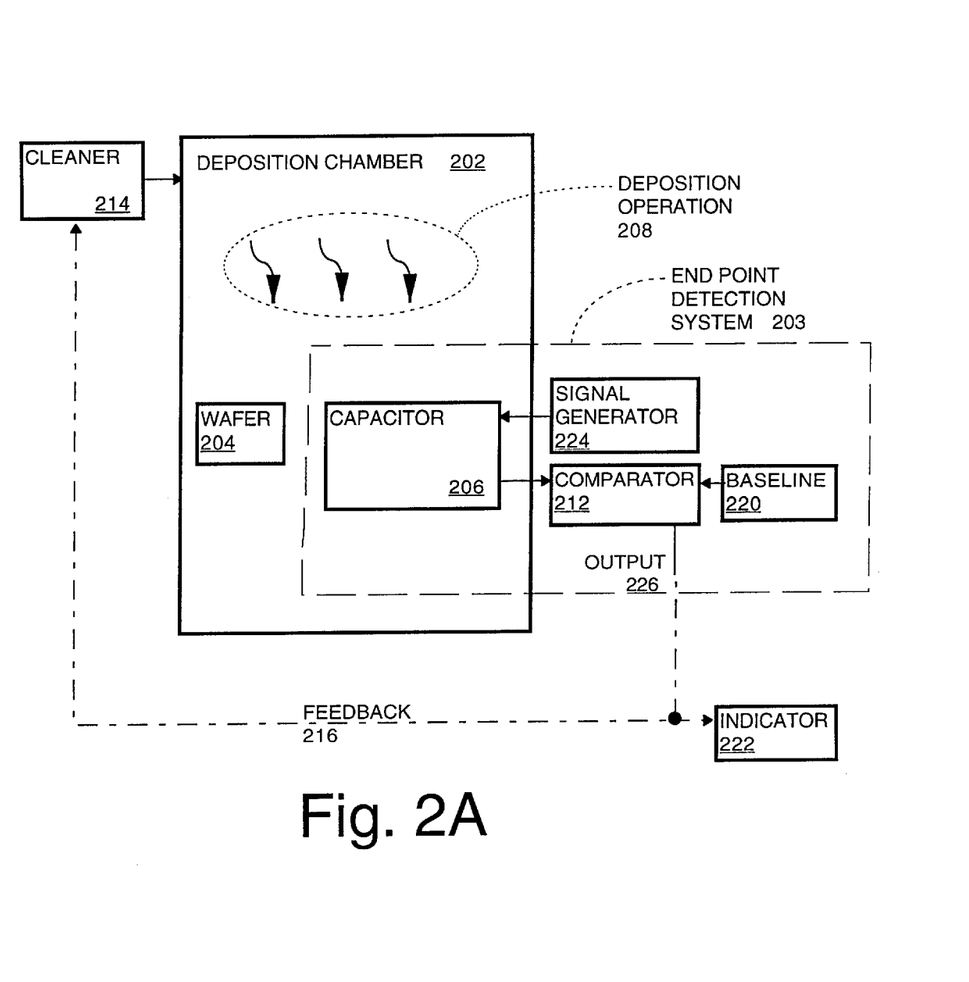
FIG. 2A is a block diagram of an end point detection system for a cleaning operation on a deposition chamber, in accordance with one embodiment of the present invention.

Referring now to FIG. 2A, a block diagram 200 of an end point detection system 203 for a cleaner 214 on a deposition chamber 202 is shown, in accordance with one embodiment of the present invention. Specifically, end point detection system 203 includes a capacitor 206, a signal generator 224, a comparator 212, and a baseline performance block 220. Capacitor 206 is physically located inside deposition chamber where it will be exposed to the same deposition environment seen by the CVD chamber walls. Capacitor 206 is coupled to comparator 212 and to signal generator 224. Comparator 212 is also coupled to baseline performance block 220. Comparator 212 has an output 226 that can be either coupled to an indicator 222 or to a feedback loop 216 to the remote cleaner block 214, or to both.

The present embodiment of FIG. 2A utilizes a capacitor 206 for sensing the build up, and removal, of deposition material. However, the present invention is well-suited to using alternative electrical devices to sense the buildup and removal of deposition material. For example, the emissivity of a light emitting diode could be monitored for change due to buildup and removal of a deposition material. While the present embodiment shows only a single capacitor inside deposition chamber 202, the present invention is well-suited to using multiple capacitive elements to sense the deposition and cleaning operations conducted in deposition chamber 202. For example, multiple end-point detection circuits could be utilized and averaged together to provide a more evenly balanced detection system. This system could take advantage of variations in the deposition operation and the sensing system, thus reducing some of the "noise" in the sensing system. Alternatively, the capacitors can be coupled together, e.g. in parallel, to provide a more sensitive response.

Baseline block 220 provides a baseline performance characteristic of a capacitor, or chosen electrical device, for monitoring cleaning. The baseline performance characteristic is based on the electrical device used to sense the buildup and removal of the deposition material on its surface. Thus, the baseline performance can be a performance characteristic such as a baseline threshold voltage or a baseline time constant. Performance characteristic of baseline block 220 can be established by a variety of sources. For example, the baseline performance characteristic could be a live input value from a duplicate electrical device that is not exposed to the deposition operation. Alternatively, the performance characteristic could be established by some other electrical source, such as a voltage source. Still another embodiment could generate the baseline performance characteristic from memory within a digital system.

Deposition chamber 202 of FIG. 2A has a wafer 204 and capacitor 206 located therein. The construction and operation of a deposition chamber 202 are well-known in the art, and are omitted herein for clarity. Deposition chamber 202 can be any type of deposition chamber. For example, the deposition chamber could be a plasma enhanced chemical vapor deposition chamber (PECVD) or a high density plasma chemical vapor deposition chamber (HDP CVD). While the present embodiment is applied to cleaning a chamber, the present invention is well-suited to cleaning any equipment or apparatus exposed to deposition or layer buildup. The present invention is also well-suited to monitoring the layer built up on apparatus, such as the deposition chamber, during the deposition operation.

Cleaner 214 of FIG. 2A can be any type of remote cleaner. For example, cleaner 214 can be a remote microwave plasma clean system that generates fluorine radicals using microwave energy. The arrow coupling cleaner 214 to deposition chamber 202 shows that the fluorine radicals are transported from remote cleaner block 214 to deposition chamber 202. In this manner, the remote system avoids bombarding chamber walls with ion energy, thereby preventing damage to the chamber walls. While the present embodiment utilizes a remote cleaner 214, the present invention is applicable to other types of cleaning systems, such as a local cleaner. Furthermore, while the present embodiment utilizes fluorine medium for cleaning, the present invention is well-suited to using alternative cleaning materials.

Figure 2B:
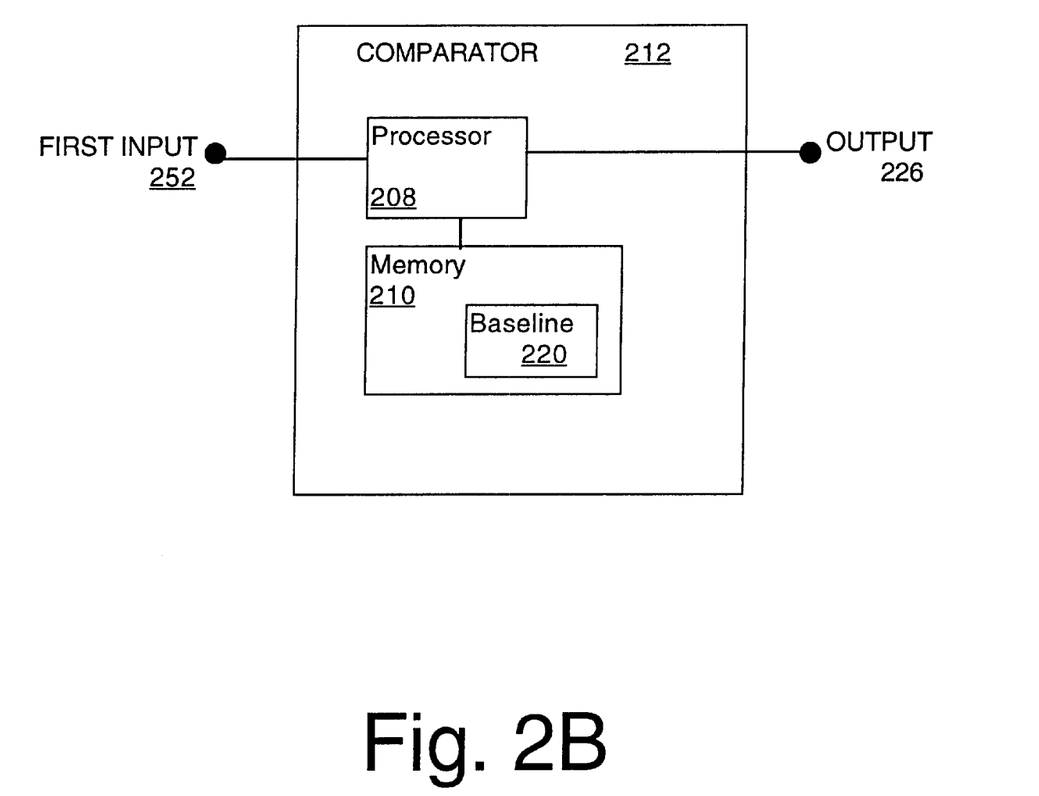
FIG. 2B is a block diagram of one embodiment of a comparator used in an end point detection system, in accordance with one embodiment of the present invention.

Referring now to FIG. 2B, a block diagram of one embodiment of a comparator 212 used in an end point detection system is shown, in accordance with one embodiment of the present invention. Comparator 212 includes a processor 208 and a memory 210, coupled to each other. First input 252 and output 226 are coupled to processor 208. In the present embodiment, first input 252 is the input provided by capacitor block 206 in FIG. 2A.

Baseline block 220, located in memory 210, holds the baseline performance characteristic of an electrical device. The baseline performance characteristic can be any of a number of performance characteristics noted for baseline block 220 in FIG. 2A. By locating baseline block 220 in memory, the present embodiment provides a quick and compact method of establishing a baseline performance characteristic.

Memory 210 used in comparator 212 of the present invention, can either be permanent memory, such as read only memory (ROM), or temporary memory such as random access memory (RAM). Memory 210 can also be any other type of memory storage, capable of containing program instructions, such as a hard drive, a CD ROM, or flash memory. Furthermore, processor 208 can either be a dedicated controller, an existing system processor, a microprocessor, or some form of a state machine. While the present embodiment shows memory and processor unit located in comparator block, any processor and memory unit can be used, e.g. the process and memory of the deposition chamber.

Figure 2C:
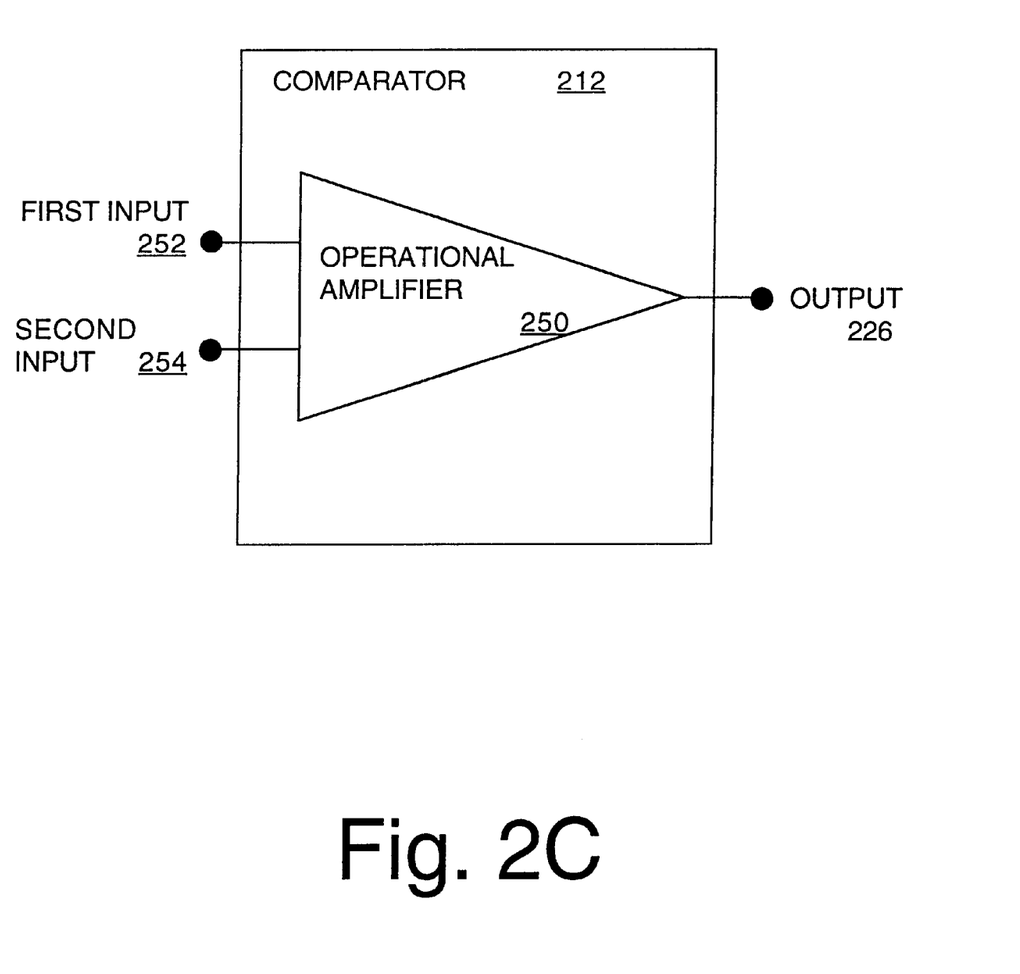
FIG. 2C is a block diagram of another embodiment of a comparator used in an end point detection system, in accordance with one embodiment of the present invention.

Referring now to FIG. 2C, a block diagram of another embodiment of a comparator used in an end point detection system is shown, in accordance with one embodiment of the present invention. Comparator 212 includes an operational amplifier 250 coupled to first input 252 and second input 254, as well as output 226 leads. Operational amplifier 250 changes its output 226 from one logic level to another logic level, e.g. from high to low in one embodiment, when first input 252 reaches a threshold voltage established by second input 254. In this embodiment, the threshold voltage is the baseline performance characteristic of the capacitor while the performance of capacitor in deposition chamber is provided as the first input.

Operational amplifier 250 can be one of many different configurations that are well-known in the art. For example, operational amplifier 250 can be a simple threshold detector or it can be a high-speed complementary CMOS comparator. Alternatively, operational amplifier 250 can perform the function of a level detector to monitor a physical variable such as the voltage, or a window detector to indicate when an input voltage comes between a specified voltage band.

Figure 3A:
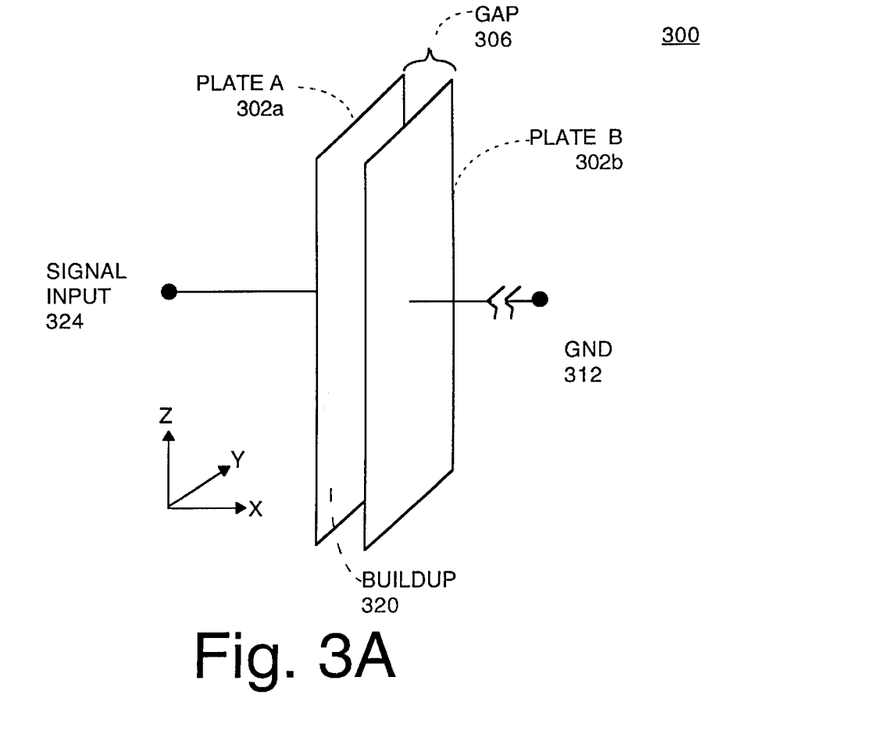
FIG. 3A is a parallel plate capacitor used in the end point detection system, in accordance with one embodiment of the present invention.

Referring now to FIG. 3A, a parallel plate capacitor used in the end point detection system is shown, in accordance with one embodiment of the present invention. Parallel plate capacitor 300 includes a first plate, plate A 302a, and a second plate, plate B 302b, separated by a gap 306. Initially, gap 306 is filled by ambient atmosphere. Signal input 324 is coupled to plate A 302a while ground, GND 312, is coupled to plate B. Signal input 324 can be coupled to signal generator 224 of FIG. 2A. A buildup 320 occurs between plates 302a and 302b as a result of the deposition operation. This buildup changes the capacitive effect of the plates.

The capacitance, C, of the capacitor is based on the area A of the plates, in meters squared, on the permittivity e in farads/meter, and on the distance between the plates d in meters, as shown in the following equation [1.1]:

$$C = e * A / d \qquad [\text{Eq.1.1}]$$

By placing different dielectric materials between the parallel plates, 302a and 302b, the performance of the capacitor changes. Specifically, the relative permittivity, $e_r$, equal to the permittivity of the material in question divided by the permittivity of vacuum, can vary as shown in Table 1.2:

TABLE 1.2

Dielectric Material vs. Permittivity, $e_r$

| Dielectric Material | $e_r$ |
|---|---|
| Vacuum | 1.0 |
| Air | 1.0006 |
| Teflon | 2.0 |

This characteristic performance of a capacitor allows it to sense a change of materials between the plates of the capacitor. For example, a baseline capacitor with only a vacuum between the plates will show a drastic change in capacitance during deposition, e.g. a twofold change in capacitance occurs to the extent that the vacuum between the plates is replaced by another insulator, such as Teflon.

Figure 3B:
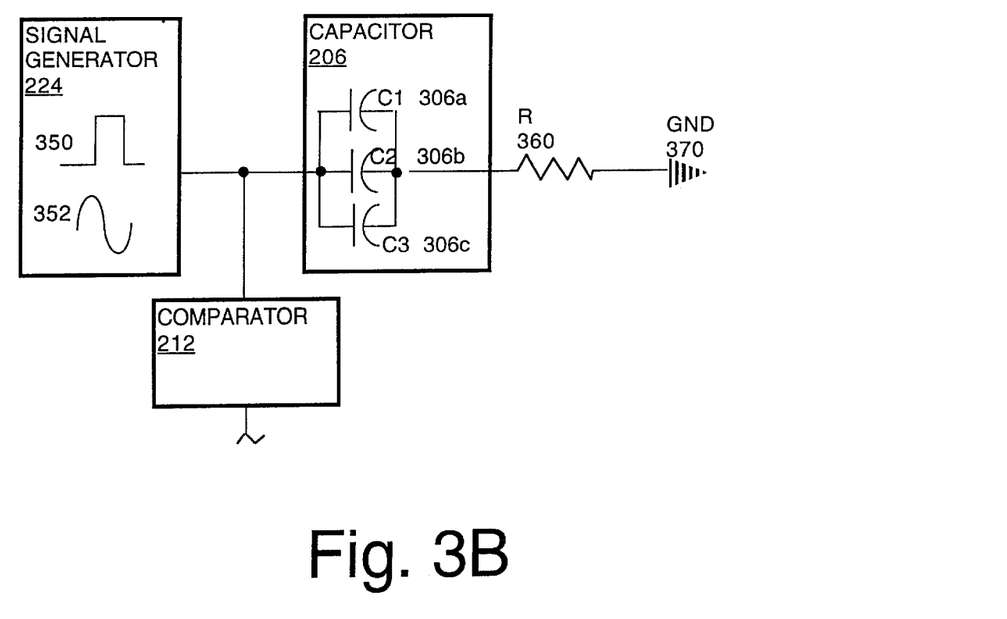
FIG. 3B is a capacitive circuit used in the end point detection system, in accordance with one embodiment of the present invention.

Referring now to FIG. 3B, a capacitive circuit used in the end point detection system is shown, in accordance with one embodiment of the present invention. Signal generator 224 can have a pulse input signal 350 or a sine wave alternating current input 352, depending on the comparator circuit and end-point detection system chosen for a given application. Signal generator 224 is coupled to a capacitor 206 in FIG. 3B, in a manner similar to that shown in FIG. 2A. Capacitor 260 is coupled to resistive element 360, which is in turn coupled to ground 370. This circuit arrangement provides a dynamic resistive-capacitive (RC) network.

Capacitor 206 is shown in FIG. 3B as having three capacitive elements 306a–306c coupled together. By coupling multiple capacitors together, in parallel, the sensitivity of the circuit is enhanced. In parallel, a change in the capacitance of all of capacitors will have a multiplying effect on the capacitance of the overall system. More specifically, the total capacitance $C_T$ of this circuit is shown in Equation 1.2 as:

$$C_T = C_1 + C_2 + C_3 \quad [\text{Eq. 1.2}]$$

where $C_1$ through $C_3$ represents the respective capacitance of each of the capacitors. Thus, if the capacitance of the three capacitors in parallel changes due to the material deposited between, or removed from, the plates, then the total capacitance, for a given supply voltage, of the circuit will increase by the emissivity change times a factor equal to the number of capacitors coupled in parallel. Hence, its performance will be enhanced.

The enhanced performance is manifested by the time constant performance of the capacitive circuit, as described in Equation 1.3:

$$\tau = R^* C_T \quad [\text{Eq 1.3}]$$

where R is the resistance of the element coupled to the capacitor and to ground, and $C_T$ is the total capacitance of the capacitive circuit. The resultant transient voltage of the capacitor as it discharges is defined in equation 1.4:

$$v_c(t) = E^*(1 - e^{-t/\tau}) \quad [\text{Eq. 1.4}]$$

where E is the supply voltage, $v_c(t)$ is the transient voltage of the capacitor over time t, and e is the natural log. Thus, when the total capacitance $C_T$ of the capacitive circuit increases, the time constant increases, and the transient voltage of the network is affected substantially.

While the present configuration utilizes a parallel coupling of elements, the present invention is also well-suited to using alternative embodiments, such as parallel coupling. Furthermore, the size of the plates and their distance apart can have a wide variety of dimensions, depending on the application and the desired response of the system.

Figure 4:
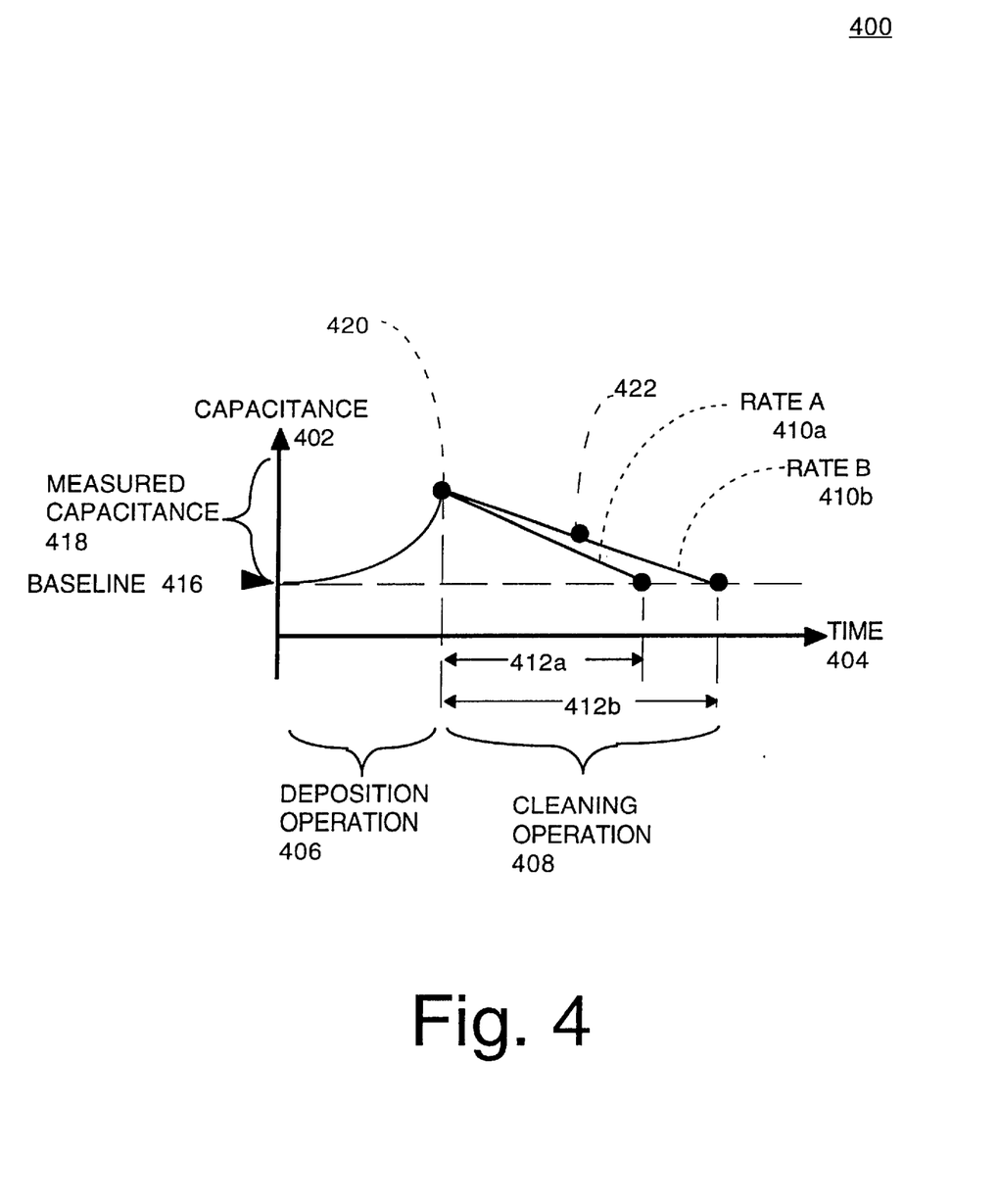
FIG. 4 is a graph showing the performance of the end point detection scheme for a remote cleaning operation, in accordance with one embodiment of the present invention.

Referring now to FIG. 4, a graph showing the performance of the end point detection scheme for a remote cleaning operation is shown, in accordance with one embodiment of the present invention. Graph 400 has an abscissa of time 404 and an ordinate of capacitance 402. Deposition operation 406, occurring over a period of time, results in a buildup of a layer thickness 320 on capacitor 300 as shown in FIG. 3A, and on deposition equipment, such as the walls of a CVD chamber 202 as shown in FIG. 2A. Following deposition operation 406 is a cleaning operation, that occurs over a period of time 408. The measured capacitance 418 occurs over both deposition operation 406 and over cleaning operation 408. In this manner, the end point detection system for detecting the end of a cleaning operation can also be utilized for detecting when the deposition operation should cease and the cleaning operation begin.

Graph 400 indicates that, regardless of the rate of cleaning, e.g. rate A 410a or rate B 410b, and regardless of the time of cleaning 412a or 412b, the cleaning operation 408 continues until measured capacitance 418 reaches approximately baseline capacitance level 416. By using the present invention, undercleaning of the chamber walls is prevented. Thus, the present invention reduces the possibility of contaminant from insufficiently cleaned chamber walls. This in turn reduces the possibility of degrading the yield or performance of ICs created in the chamber. Likewise, the present invention avoids overcleaning of the chamber walls. Resultantly, the present invention protects the chamber walls from damage arising from overcleaning. In all, the present invention provides an accurate mechanism and apparatus for efficiently maintaining the cleanliness of a deposition chamber.

Figure 5:
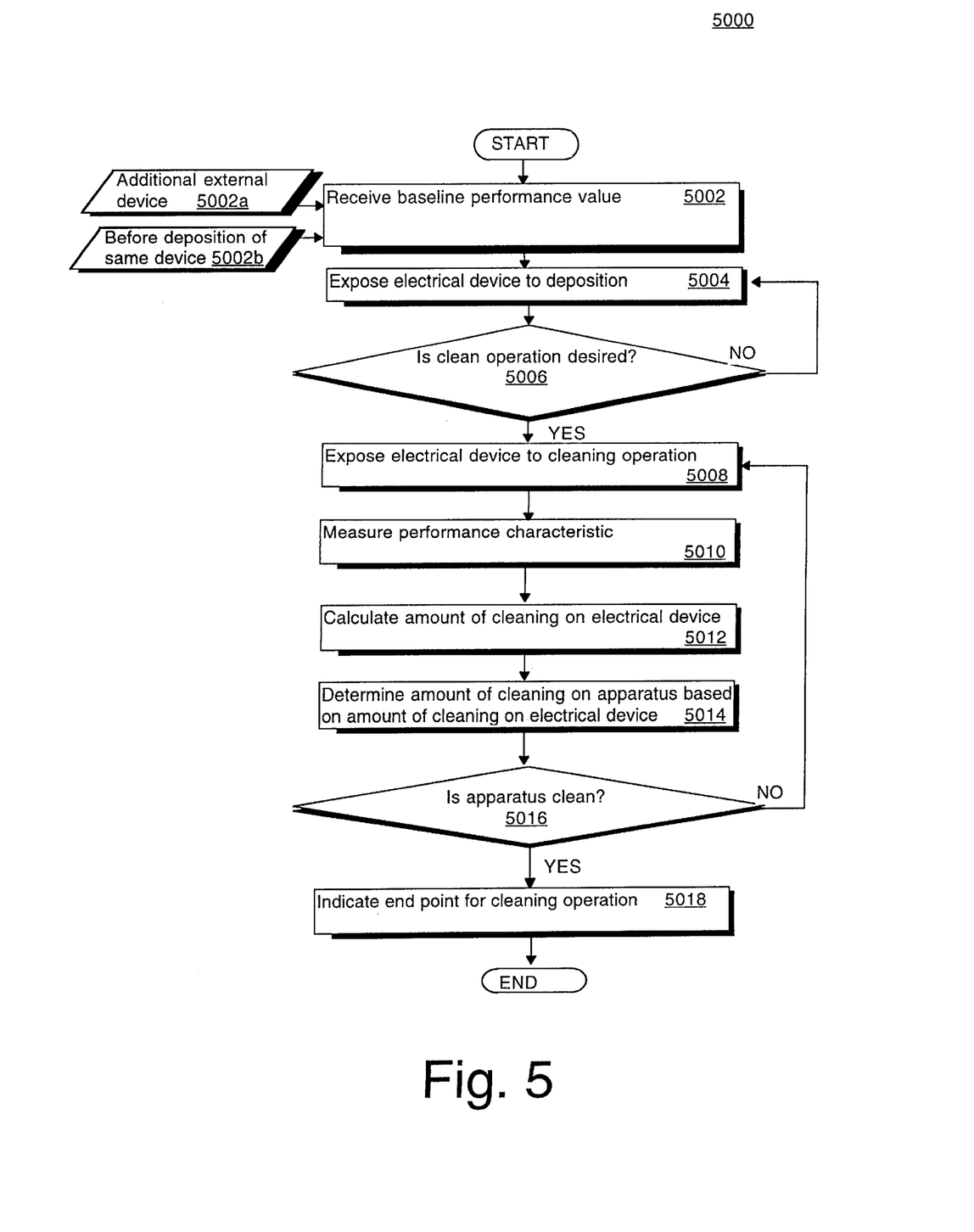
FIG. 5 is a flowchart of the steps performed for accurate end point detection for a remote cleaning operation, in accordance with one embodiment of the present invention.

Referring now to FIG. 5, a flowchart 5000 of the steps performed for accurate end point detection for a remote cleaning operation is shown, in accordance with one embodiment of the present invention. By using the flowchart 5000 embodiment of the present invention, accurate end point detection of remote cleaning for a deposition chamber is obtained. This saves time, money, and resources by reducing the contaminant in the deposition chamber, by cleaning the deposition chamber only the amount needed, and by preventing damage to chamber walls from overcleaning. While the present embodiment of flowchart 5000 is applied to detecting an end-point of a cleaning operation, the present invention is also well-suited to detecting when deposition operations have reached a critical layer buildup in a deposition chamber and consequently requiring a cleaning operation. Additionally, while the present embodiment implements flowchart 5000 in a deposition chamber, the present invention can be implemented for deposition operations and cleaning operations of other apparatus.

Flowchart 5000 begins with step 5002. In step 5002 of the present embodiment, a baseline value of a performance characteristic of an electrical device is received. In one embodiment, the performance characteristic is a capacitance value of a capacitor. In other embodiments, the performance condition is a threshold voltage, or a time constant characteristic of a capacitive element. Alternatively, the present invention is well-suited to using an alternative electrical device whose performance characteristic is affected by the deposition operation or cleaning to remove the deposition buildup. For example, the device can be a light emitting diode whose performance characteristic of intensity is affected by the deposition operation and cleaning operation of the deposition buildup.

The source of the baseline value is provided by an additional external device, e.g. input 5002a of FIG. 5, in one embodiment. Alternatively, baseline performance value is provided by a given device before deposition is performed on that same device, e.g. input 5002b of FIG. 5, in another embodiment. Step 5002 is implemented, in one embodiment, by the baseline block 220 shown in FIG. 2A. More specifically, baseline performance value can be received from a memory unit, shown as baseline block 220 in memory block 210 of FIG. 2B. Alternatively, the performance value can be received from a duplicate electrical device that is not subjected to the deposition or cleaning operations, thus always providing a constant baseline value over time. Still another alternative is to provide a baseline performance characteristic from a different device that exhibits the theoretical baseline value. For example, a voltage regulator could provide a constant voltage source that represents the theoretical baseline performance characteristic of the electrical device used to monitor the deposition and cleaning operations. Following step 5002, flowchart 5000 proceeds to step 5004.

In step 5004 of the present embodiment, the electrical device is exposed to a deposition operation. Step 5004 is implemented, in one embodiment, by exposing capacitor 206 to deposition operation 208 within deposition chamber 202, as shown in FIG. 2A. In this manner, the deposition operation will surround the capacitor 206 with the deposition medium that will adhere to the plates and change the capacitance of the capacitor 206. While the present invention places the electrical device in the deposition chamber, the present invention is well-suited to exposing the electrical device in some other apparatus that fairly represents the deposition operation exposed to the chamber walls of the deposition chamber. For example, the electrical device may be housed in a conduit linking the remote cleaning generation device to the deposition chamber.

The deposition buildup on a parallel plate capacitor 300 arising from step 5004 is shown in FIG. 3A, in one embodiment. Parallel plate capacitor 300 has a buildup 320 between plates 302a and 302b that affects capacitance. While the present embodiment shows a specific orientation and physical parameters of the capacitor, the present invention is well-suited to using many different configurations of a capacitor. For example, multiple capacitors can be coupled, in parallel or in series, to provide a faster, more accurate, or more balanced response. For example, FIG. 3B provides an example of three capacitors coupled in parallel to provide an enhanced response characteristic. The present invention is well-suited to using capacitors having a configuration other than a flat parallel-plate configuration. For example, the electrical device can be a rolled parallel plate capacitor. Following step 5004, flowchart 5000 proceeds to step 5006.

In step 5006 of the present embodiment, an inquiry determines whether a cleaning operation is desired. If a cleaning operation is desired, then flowchart 5000 proceeds to step 5008. However, if cleaning operation is not desired, then flowchart 5000 returns to step 5004.

For step 5006, the present invention is well-suited to using any basis upon which to determine the initiation of the cleaning operation. For example, the basis for initiating a cleaning operation can be based upon the yield or performance of the integrated circuits or wafers subjected to the deposition operation. Alternatively, the cleaning operation can be initiated based on an accumulated deposition time that correlates to the deposition buildup on, and contaminant slough from, the chamber walls.

Still another embodiment for step 5006 can initiate cleaning based on the performance of the electrical device used to monitor the cleaning operation. That is, the change in the performance characteristic away from the baseline value can be the basis upon which the cleaning operation is initiated. For example, a performance characteristic, such as those discussed in step 5002, can be measured during deposition operation to indicate the thickness of the deposition layer, e.g. measure capacitance 418 during deposition operation 406 as shown in FIG. 4. In this case, the deposition operation 406 ceases when a threshold capacitance level 420 is reached for electrical device exposed to the deposition operation. The choice of a specific threshold capacitance, or other performance characteristic level, can be based upon empirical data for contaminant generated from the chamber walls, or some other factor.

Step 5008 arises if the cleaning operation is desired, per the inquiry of step 5006. In step 5008 of the present embodiment, the electrical device is exposed to a cleaning operation. Step 5008 is implemented, in one embodiment, by cleaner 214 of FIG. 2A. The present invention is well-suited to using any type of cleaning configuration for cleaner 214. For example, cleaner 214 can be a remote microwave plasma clean system that generates fluorine radicals using microwave energy. Alternatively, the present invention is well-suited to using a local cleaning system as well. Furthermore, while the present embodiment utilizes fluorine medium for cleaning, the present invention is well-suited to using alternative cleaning materials. Following step 5008, flowchart 5000 proceeds to step 5010.

In step 5010 of the present embodiment, the performance characteristic of the electrical device is measured. The performance characteristic of step 5010 is the same as that used for step 5002. Alternatively, a different performance characteristic can be utilized if there is a reasonable correlation to the performance characteristic used for the baseline. Step 5010 is shown, in one embodiment, by graph 400 of FIG. 4. Measured capacitance 418 occurs during cleaning operation 408. Step 5010 is implemented, in one embodiment, by the comparator 212 of FIG. 2A. More specific embodiments of the comparator are shown in FIG. 2B as a digital embodiment, and in FIG. 2C as an analog embodiment. Following step 5010, flowchart 5000 proceeds to step 5012.

In step 5012 of the present embodiment, an amount of cleaning performed on the electrical device is calculated. That is, based upon empirical or analytic data, the measured performance characteristic from step 5010 can be compared to the baseline value of the performance characteristic from step 5002 to determine how close the two values are, and hence to determine the cleanliness of the capacitor. Step 5012 is implemented, in one embodiment, by using data from graph 400 of FIG. 4. For example, if the cleaning operation is linear, e.g. rate A 410a, and if the measured performance characteristic is at point 422, then the capacitor is approximately half-way to the baseline value 416, and consequently approximately half clean. The present invention is well-suited to use of many different cleaning performances and to many different models that either analytically or empirically determine the amount of cleaning performed on the electrical device. Following step 5012, flowchart 5000 proceeds to step 5014.

In step 5014 of the present embodiment, an amount of cleaning on an apparatus is determined based upon the amount of cleaning on the electrical device. Step 5014 translates the information on the amount of cleaning performed on the electrical device from step 5012 into an estimation about the amount of cleaning performed on the chamber walls. Similarly to step 5012, the present invention is well-suited to using many different empirical and analytic models that correlate or predict the relationship between the cleanliness of the electrical device to the cleanliness of the chamber walls. This step assumes that, based on the different geometries, size, and physical interactions, the deposition results on the chamber walls will not be exactly the same as the deposition results on the electrical device. This step allows an opportunity to provide a translation factor for additional refinement in the overall process of determining the true amount of cleaning actually performed on the apparatus. Following step 5014, flowchart 5000 proceeds to step 5016.

In step 5016 of the present embodiment, an inquiry determines whether the apparatus is clean. If the apparatus is determined to be clean, then flowchart 5000 proceeds to step 5018. However, if the apparatus is determined to be not clean, then flowchart 5000 returns to step 5008. In this manner, the present invention monitors the progress of the cleaning operation to determine when it is complete. The present invention is well-suited to the use of different times at which the inquiry occurs and different frequencies at which the inquiry occurs.

Step 5018 arises if the apparatus is determined to be clean, per the inquiry of step 5016. In step 5018 of the present embodiment, the end point for the cleaning operation is indicated. The indication can be provided by different embodiments, such as the embodiment of FIG. 2A where output 226 from comparator 212 is coupled to indicator 222. Indicator 222 can be some audiovisual device that signifies the completion of the cleaning operation. Alternatively, the same output 226 of FIG. 2A can be coupled to cleaner unit 214 via a feedback line 216 to automatically discontinue the cleaning operation. While the present embodiments provide specific examples indicating the cleaning operation is completed, the present invention is well-suited to using any type of indicator. Following step 5018, flowchart 5000 ends.

While flowchart 5000 of the present embodiment shows a specific sequence and quantity of steps, the present invention is suitable to alternative embodiments. For example, not all the steps provided for flowchart 5000 are required for the present invention. Furthermore, additional steps may be added to the steps presented in the present embodiment. Likewise, the sequence of the steps can be modified depending upon the application. While flowchart 5000 is shown as a single serial process, it can also be implemented as a continuous or parallel process.

Many of the instructions for the steps, and the data input and output from the steps, of flowchart 5000 can be performed manually, by analog circuit, or by digital circuit. With a digital circuit, steps and data can be stored in memory and implemented by a processor. For example, the memory 210 and processor 208 of comparator 212 can belong to the deposition chamber, or its controller, or to the cleaning operation system. The memory storage for the present embodiment can either be permanent, such as read only memory (ROM), or temporary memory such as random access memory (RAM). Memory can also be any other type of memory storage, capable of containing program instructions, such as a hard drive, a CD ROM, or flash memory. Furthermore, processor can either be a dedicated controller, an existing system processor, or it can be a dedicated digital signal processing (DSP) processor. Alternatively, the instructions may be implemented using some form of a state machine.

In view of the embodiments presented herein, the present invention provides a method to reduce contamination during the fabrication of an IC. More specifically, the present invention provides a method to accurately remove the buildup of material on a CVD chamber wall arising from the deposition operation. The present invention does so by providing a method to determine the end point of a remote cleaning operation. In particular, the present invention provides such an accurate method of determining when a remote cleaning operation has been completed on a CVD chamber wall that it substantially eliminates the detrimental effects of both undercleaning and overcleaning.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method of determining an endpoint for a cleaning operation, comprising:

performing a deposition operation in a deposition chamber, the deposition chamber including at least one electrical element disposed such that the at least one electrical element is exposed to the deposition operation;

performing a cleaning operation in the deposition chamber, the at least one electrical element disposed such that the at least one electrical element is exposed to the cleaning operation;

measuring, subsequent to a beginning of the cleaning operation, a characteristic of the at least one electrical element which is indicative of the amount of deposition and cleaning; and signalling an endpoint of the cleaning operation when the measured characteristic reaches a predetermined value;

wherein the deposition operation comprises a plasma enhanced chemical vapor deposition, the cleaning operation comprises exposing the chamber to a plasma, the at least one electrical element comprises at least one parallel plate capacitor, and the characteristic of the at least one electrical element that is measured is capacitance.

2. The method recited in claim 1, further comprising receiving said predetermined value based on measurement of the at least one electrical element prior to said deposition operation on the at least one electrical element.

3. The method recited in claim 2 wherein said predetermined value is based on performance of an additional electrical device not subject to said deposition operation.

4. The method recited in claim 1, wherein the predetermined value is stored in a memory coupled to the deposition chamber.

5. The method recited in claim 1, further comprising continuously measuring the characteristic of the at least one electrical element which is indicative of the amount of deposition and cleaning during said cleaning operation.

6. The method recited in claim 1, further comprising:

exposing the at least one electrical element to a plurality of deposition operations in the deposition chamber prior to said cleaning operation.

7. The method recited in claim 1, wherein said cleaning operation is a remote microwave plasma cleaning operation.

8. The method recited in claim 1, wherein the predetermined value of the measured characteristic is measured on a second electrical device that is not exposed to said deposition operation.

9. A method of determining an amount of cleaning performed in an apparatus used in a deposition operation, said method comprising:

performing said deposition operation in a chemical vapor deposition (CVD) chamber;

exposing a first electrical device to the deposition operation in said CVD chamber;

exposing the CVD chamber to a cleaning operation;

exposing the first electrical device to the cleaning operation in the CVD chamber;

measuring a value for a performance characteristic of the first electrical device; and comparing a baseline value of the performance characteristic with the measured value for the performance characteristic in order to determine an amount of cleaning performed on the first electrical device;

wherein said performance characteristic changes with deposition and cleaning, the first electrical device is a parallel plate capacitor, and the performance characteristic is a capacitance value for the first electrical device.

* * * * *